United States Patent
Nishi

(10) Patent No.: US 9,769,966 B2
(45) Date of Patent: Sep. 19, 2017

(54) EMI SHIELDING STRUCTURE TO ENABLE HEAT SPREADING AND LOW COST ASSEMBLY

(71) Applicant: Intel Corporation, Santa Clara, CA (US)

(72) Inventor: Yoshifumi Nishi, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 14/866,275

(22) Filed: Sep. 25, 2015

(65) Prior Publication Data

US 2017/0094844 A1    Mar. 30, 2017

(51) Int. Cl.
*H05K 7/20* (2006.01)
*H05K 9/00* (2006.01)
*H01L 23/367* (2006.01)

(52) U.S. Cl.
CPC ......... *H05K 9/0024* (2013.01); *H01L 23/367* (2013.01); *H05K 7/20436* (2013.01); *H05K 9/0032* (2013.01)

(58) Field of Classification Search
CPC .................................................... H05K 9/0032
See application file for complete search history.

(56) References Cited

U.S. PATENT DOCUMENTS

| | | | | |
|---|---|---|---|---|
| 4,564,880 A * | 1/1986 | Christ | ............... | H01L 21/67353 206/719 |
| 5,307,236 A * | 4/1994 | Rio | ..................... | H01L 23/4006 165/80.3 |
| 6,049,469 A * | 4/2000 | Hood, III | ................ | G06F 1/182 174/388 |
| 6,388,189 B1 * | 5/2002 | Onoue | ................. | H05K 7/2039 174/383 |
| 6,787,695 B2 * | 9/2004 | Martin, Jr. | ........... | H05K 9/0032 174/384 |
| 6,809,932 B2 * | 10/2004 | Wu | ...................... | H05K 9/0024 165/185 |
| 6,870,091 B2 * | 3/2005 | Seidler | ................. | H05K 9/0032 174/382 |
| 7,084,356 B2 * | 8/2006 | English | ................ | B23K 1/0016 174/361 |
| 7,170,014 B1 * | 1/2007 | Liang | .................... | H01L 23/367 174/377 |
| 7,808,572 B2 * | 10/2010 | Lee | ................... | G02F 1/133608 349/58 |
| 8,077,476 B2 * | 12/2011 | Yasuda | ............... | H01L 23/4093 165/185 |

(Continued)

FOREIGN PATENT DOCUMENTS

| | | | | |
|---|---|---|---|---|
| DE | 19836887 A1 * | 2/2000 | ............. | H05K 7/142 |
| JP | WO 2005041628 A1 * | 5/2005 | ......... | H05K 7/20436 |

*Primary Examiner* — Robert J Hoffberg
(74) *Attorney, Agent, or Firm* — Alpine Technology Law Group LLC

(57) ABSTRACT

Methods and apparatus relating to EMI (Electromagnetic Interference) shielding structure to enable heat spreading and/or low cost assembly are described. In an embodiment, a metallic shield at least partially surrounds at least one logic component. The metallic shield includes a dome feature to provide thermal contact between the at least one logic component and the metallic shield. Other embodiments are also disclosed and claimed.

25 Claims, 7 Drawing Sheets

(56) References Cited

U.S. PATENT DOCUMENTS

| | | | | |
|---|---|---|---|---|
| 8,451,600 B1* | 5/2013 | Ross | ............... | H05K 7/20545 |
| | | | | 165/80.3 |
| 8,558,127 B2* | 10/2013 | Blakely | ............ | H01H 35/343 |
| | | | | 200/83 R |
| 8,704,115 B2* | 4/2014 | Blakely | ............ | H01H 35/343 |
| | | | | 200/83 R |
| 2005/0141209 A1* | 6/2005 | Chen | ................ | H05K 9/0039 |
| | | | | 361/800 |
| 2009/0002949 A1* | 1/2009 | Pawlenko | ......... | H05K 9/0026 |
| | | | | 361/707 |

* cited by examiner

EMI SHIELDING STRUCTURE TO ENABLE HEAT SPREADING AND LOW COST ASSEMBLY

FIELD

The present disclosure generally relates to the field of electronics. More particularly, an embodiment relates to EMI (Electromagnetic Interference) shielding structure to enable heat spreading and/or low cost assembly.

BACKGROUND

Electronic devices generally rely on signal transmission to operate. Electromagnetic Interference (EMI) can affect signal transmission. For example, in digital circuitry, EMI can modify a signal that is intended to convey a logic 1 to instead convey a logic 0. Hence, such interference can cause the circuitry to generate results that are incorrect. Additionally, electronic circuitry generates heat during operation. Excessive heat may physically damage the electronic circuitry, reduce its lifespan, or even affect the operation of the electronic circuitry.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
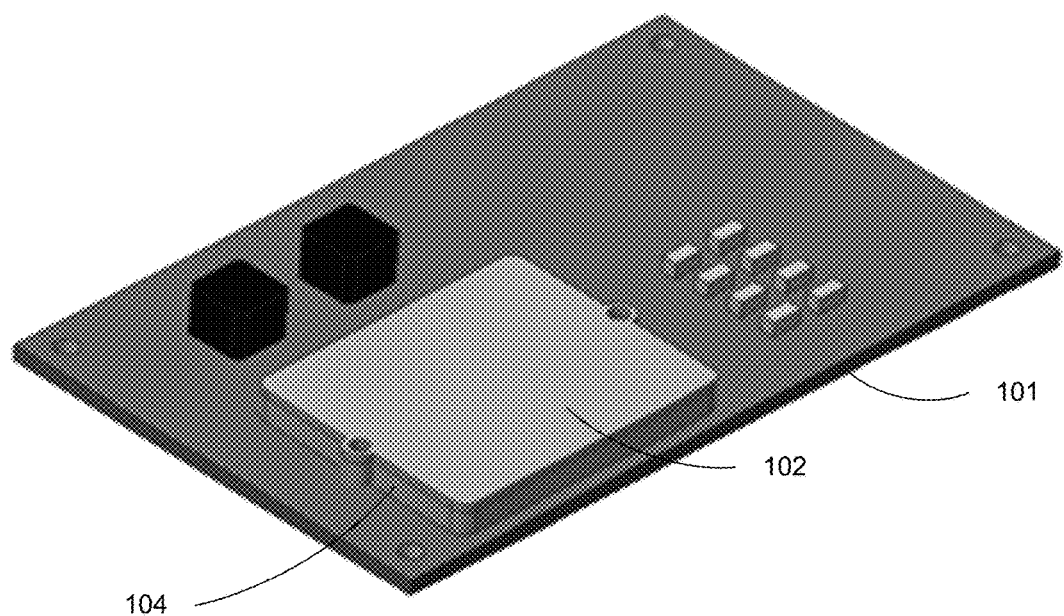
FIGS. 1 and 2 illustrate perspective views of an EMI shielding and separate heat spreading solutions.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As mentioned above, Electronic devices generally rely on signal transmission without interference to operate correctly. Also, excessive heat (e.g., generated during operation) may physically damage the electronic circuitry, reduce its lifespan, or even affect the operation of the electronic circuitry. To this end, some electronic devices may utilize an EMI shielding and/or a heat spreader to address the EMI and/or thermal management issues. In some designs, this may be achieved by placing a metal perimeter frame around the electronic components and also capping the components with a heat spreader. However, this construction requires multiple parts and assembly steps, and fails to accommodate lower cost and faster assembly goals.

Some embodiments provide an EMI (Electromagnetic Interference) shielding structure which also providing heat spreading functionality and/or low cost (as well as faster) assembly. Moreover, EMI shield for small form factor devices (which fails to provide a heat spreader function as will be further discussed with reference to FIGS. 1-2) are usually constructed of stamped sheet metal. Instead, in some embodiments, sheet metal can be stamped such that at least one of its surfaces (e.g., top and/or side surface(s)) has a dome feature that is then flipped or depressed after surface mounting of the EMI shield to make (e.g., direct physical and/or) thermal contact with the logic components. The thermal/physical contact between the dome feature and the logic component(s) would then act as a heat spreader. This way, the shield can be soldered to the motherboard together with other logic devices, e.g., without affecting the surface mount process, reducing assembly steps, reducing the number of assembly parts, and/or saving time. The dome feature may be depressed (e.g., by a user, by automated manufacturing equipment, as part of packaging, etc.).

Furthermore, some embodiments may be applied in computing systems that include one or more processors (e.g., with one or more processor cores), such as those discussed with reference to FIGS. 8-11, including for example small form factor or mobile computing devices, e.g., a smartphone, tablet, UMPC (Ultra-Mobile Personal Computer), laptop computer, Ultrabook™ computing device, wearable devices (such as a smart watch, smart glasses, etc.), 2 in 1 systems, etc. However, embodiments discussed herein are not limited to mobile computing devices and may be applied in any type of computing device, such as a work station, a server, a super computer, etc. Also, some embodiments are applied in computing devices that include a cooling fan as well as fanless computing devices.

Figure 2:
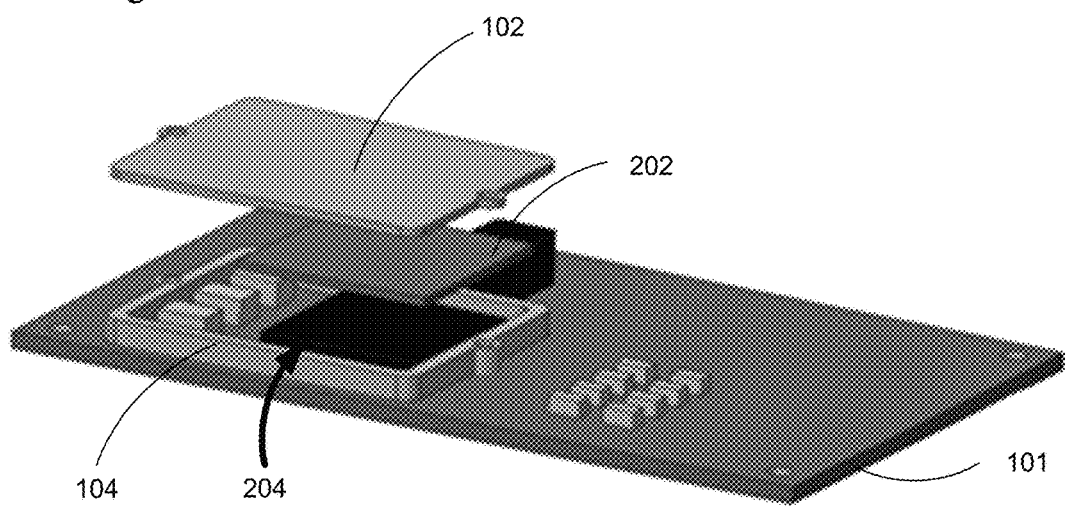

Moreover, some existing solutions for provision of EMI shielding and thermal spreading are shown in FIGS. 1 and 2. More particularly, FIG. 1 illustrates a perspective view of a circuit board 101 which may include various electronic components (shown as smaller gray and black cubes) and an EMI shield with a top portion 102 and a surrounding portion 104. FIG. 2 illustrates an exploded view of the EMI shield of FIG. 1.

As shown in FIG. 2, the top portion of the shield 102 is removable from the surrounding portion 104. A gap pad 202 may be provided between the top portion of the shield 102 and a logic component 204. The gap pad 202 facilitates a thermal contact between the shield and the logic component to help with heat dissipation. In this type of structure, a metal perimeter cage 104 is soldered to the board 101 along with other devices and the gap pad 202 may be attached later in the assembly process. Hence, to provide this shield and heat spreader, a number of assembly steps have to be performed to assemble the various parts. The process can be more time-consuming, more complex, and less cost-effective than some embodiments discussed herein.

Figure 3:
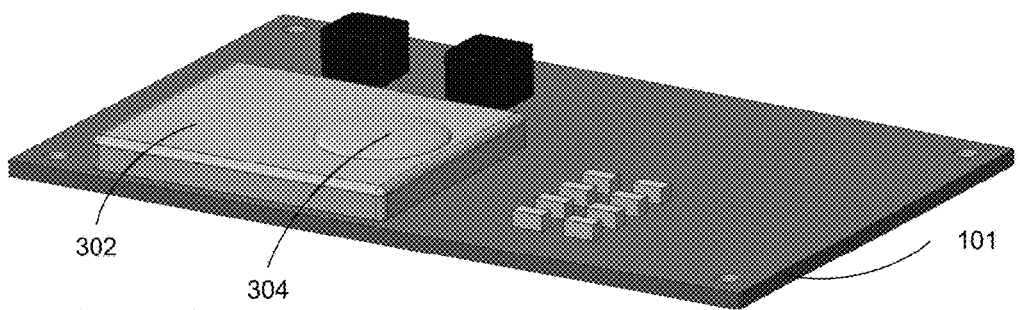
FIGS. 3, 4, 5, 6, and 7 illustrate various views of EMI shielding structures to enable heat spreading and/or low cost assembly, according to some embodiments.
Figure 4:
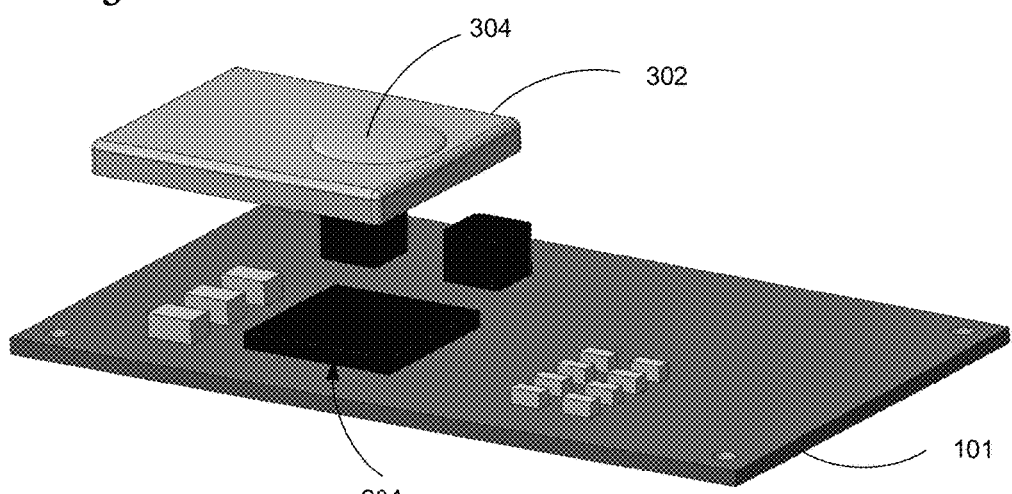
Figure 5:
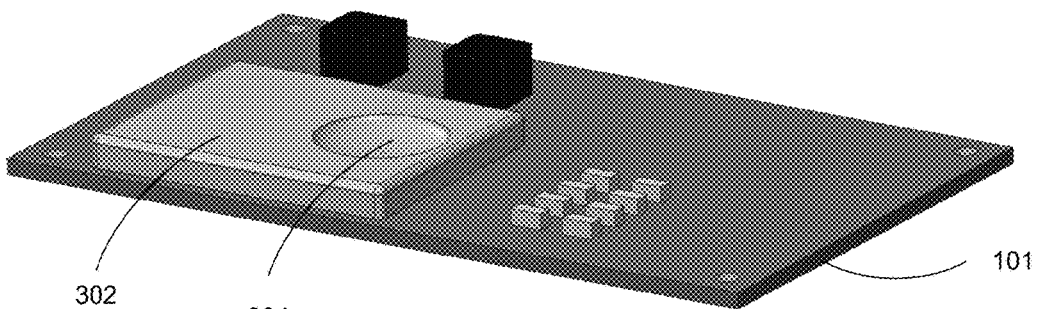
Figure 6:
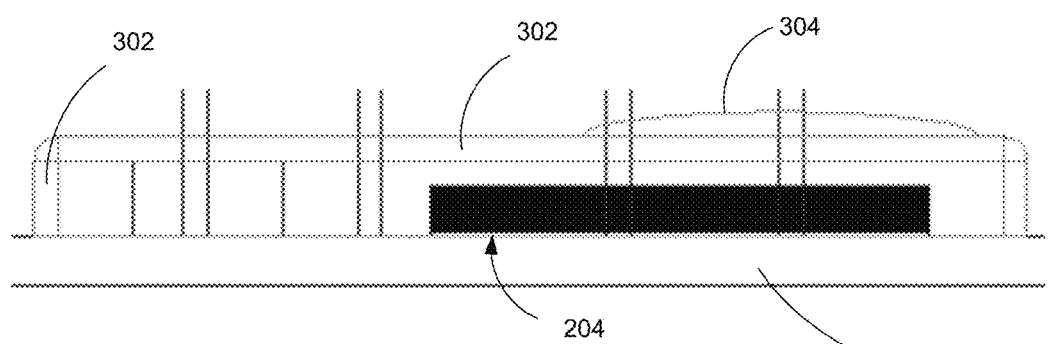
Figure 7:
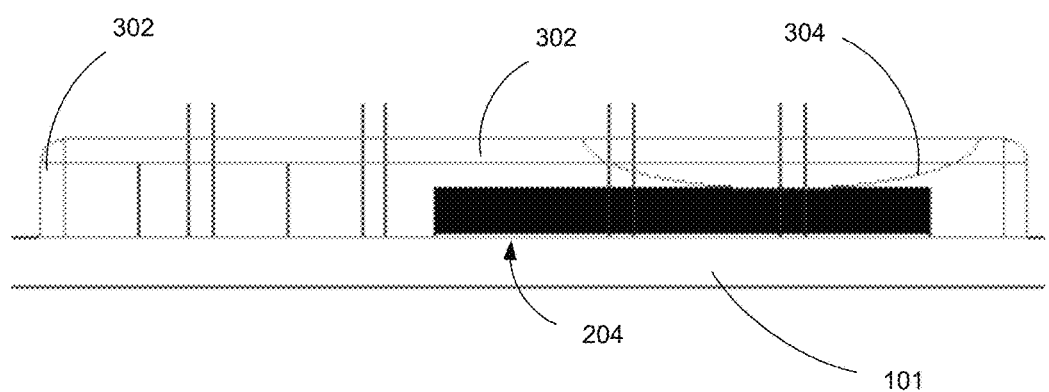

FIGS. 3, 4, 5, 6, and 7 illustrate various views of EMI shielding structure to enable heat spreading and/or low cost assembly, according to some embodiments. More specifically, FIGS. 3-5 illustrate perspective views of the EMI shield 302 according to some embodiments. FIG. 4 illustrates an exploded view. FIGS. 6 and 7 illustrate crosssectional side views of the EMI shielding structure 302 according to some embodiments.

Referring to FIGS. 3-7, some embodiments propose a new structure (e.g., constructed of stamped sheet metal, e.g., constructed with stainless steel, etc.) for an EMI shield 302, in which a dome feature 304 is provided on the top surface of the EMI shield 302. The dome feature 304 may be provided as part of a stamped sheet metal, e.g., during the same stamping process that provides the EMI shield 302, or alternatively be formed during a different stamping process (i.e., before or after the stamping process that provides the shield 302). Further, the vertical darker lines in the side view FIGS. 6 and 7 correspond to background components.

Before surface mount, this dome protrudes outward (e.g., as shown in FIGS. 3, 4, and 6), so that the dome 304 does not make physical (and/or thermal) contact with any components below the shield (such as logic component 204, as illustrated in FIG. 4, 6, or 7). The spacing provided by the protrusion (which may provide a gap of (or no more than) about 2 mm between the surface of the protruded dome and the logic component 204) is intended to not affect the soldering process or cause damage to any logic component, e.g., due to excessive force, pressure, or heating applied during the surface mount process.

As discussed herein, "surface mount" generally refers to a process in which various components (such as the shield 302 and/or logic components (e.g., 204)) are mounted onto a circuit board (or printed circuit board). The mounting may be achieved by glue and/or a soldering process. The soldering process generally includes the provision of a fusible metal alloy (also referred to as a solder), with or without flux, to join metal work pieces (such as pins and/or wires). The solder material will have a lower melting point than the work pieces. After work pieces (such as the circuit board, logic components, and/or the shield 302) are assembled and solder applied, heat is applied to reflow the solder and join the metal work pieces. In an embodiment, the EMI shield 302 may not be soldered to the circuit board as long as some distance (e.g., about 2 mm in some implementations) is maintained between the shield and logic component (except as discussed herein with reference to the dome feature 304).

Furthermore, after surface mount, the dome feature 304 can be pushed down or depressed (as shown in FIGS. 5 and 7) to make direct physical or thermal contact with the logic devices underneath (such as logic component 204). The dome feature may be depressed (e.g., by a user, by automated manufacturing equipment, as part of packaging, etc.). Additionally, the EMI shield 302 may be made of very thin sheet metal (e.g., about 0.3 mm to 0.5 mm thick in some embodiments), and this dome feature can be easily flipped.

In some embodiments, the dome feature 304 can make contact with other heat spreaders (e.g., other domes and/or a heat spreader material such as 202 of FIG. 2). Also, while FIGS. 3-7 illustrate a circular shape for the dome feature 304, other shapes may be utilized such as a square shape, an elliptical shape, a rectangular shape, a polygonal shape, combinations thereof, etc.

Figure 8:
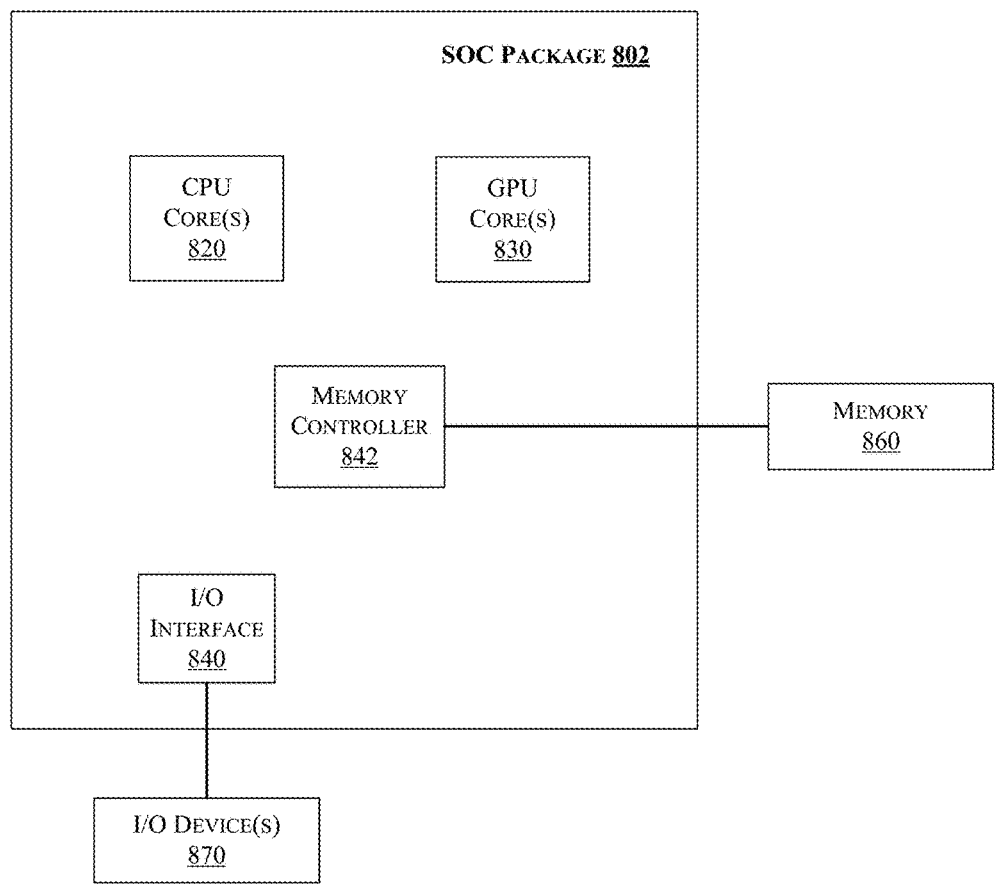
FIGS. 8 and 9 illustrate block diagrams of embodiments of computing systems, which may be utilized in various embodiments discussed herein.

In some embodiments, various components in a computing system (such as those discussed with reference to FIGS. 8-11) may be protected by the EMI shield discussed herein. Also, one or more of the components discussed herein can be embodied as a System On Chip (SOC) device. FIG. 8 illustrates a block diagram of an SOC package in accordance with an embodiment. As illustrated in FIG. 8, SOC 802 includes one or more Central Processing Unit (CPU) cores 820, one or more Graphics Processor Unit (GPU) cores 830, an Input/Output (I/O) interface 840, and a memory controller 842. Various components of the SOC package 802 may be coupled to an interconnect or bus such as discussed herein with reference to the other figures. Also, the SOC package 802 may include more or less components, such as those discussed herein with reference to the other figures. Further, each component of the SOC package 820 may include one or more other components, e.g., as discussed with reference to the other figures herein. In one embodiment, SOC package 802 (and its components) is provided on one or more Integrated Circuit (IC) die, e.g., which are packaged into a single semiconductor device.

As illustrated in FIG. 8, SOC package 802 is coupled to a memory 860 via the memory controller 842. In an embodiment, the memory 860 (or a portion of it) can be integrated on the SOC package 802.

The I/O interface 840 may be coupled to one or more I/O devices 870, e.g., via an interconnect and/or bus such as discussed herein with reference to other figures. I/O device(s) 870 may include one or more of a keyboard, a mouse, a touchpad, a display, an image/video capture device (such as a camera or camcorder/video recorder), a touch screen, a speaker, or the like.

Figure 9:
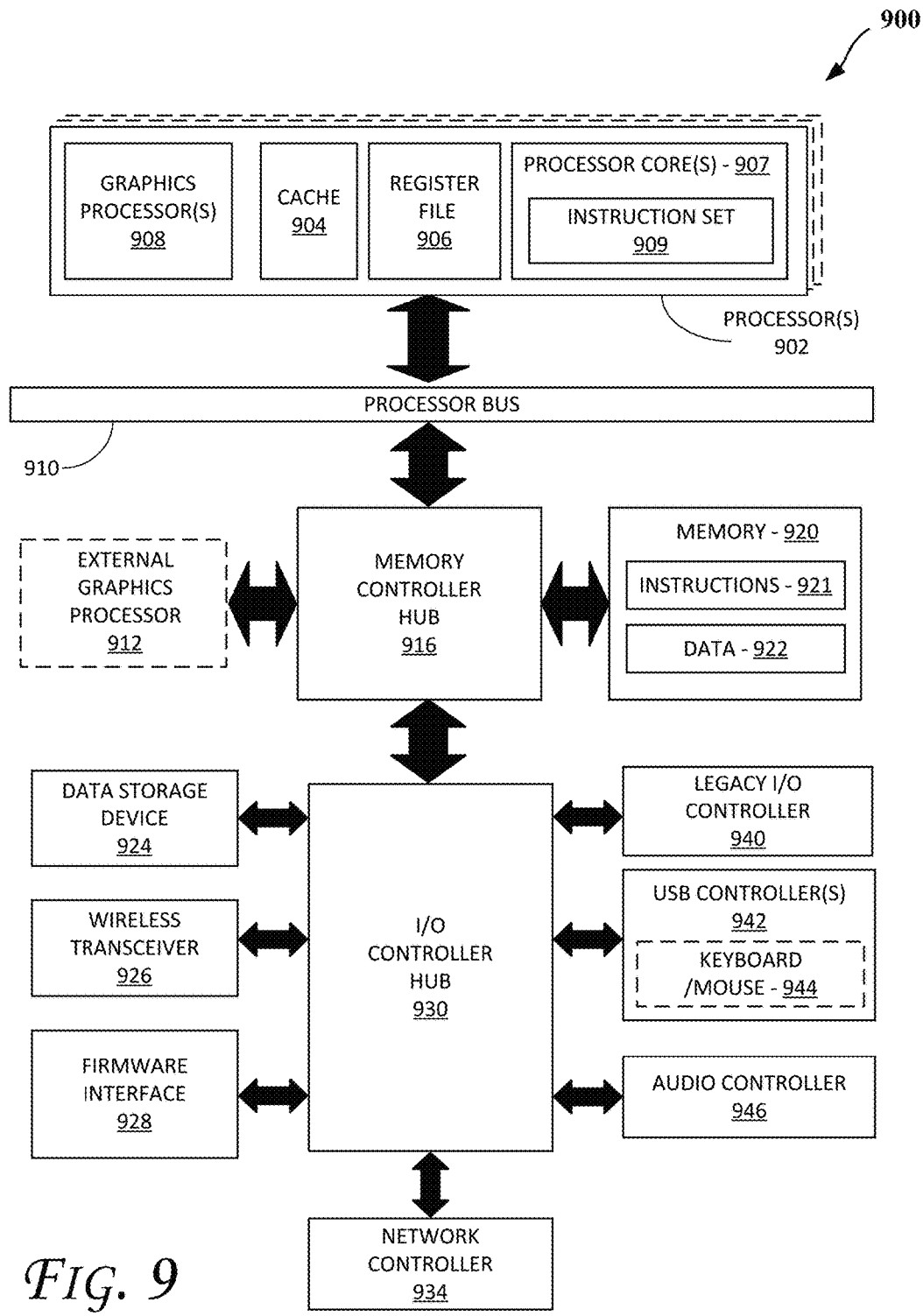

FIG. 9 is a block diagram of a processing system 900, according to an embodiment. In various embodiments the system 900 includes one or more processors 902 and one or more graphics processors 908, and may be a single processor desktop system, a multiprocessor workstation system, or a server system having a large number of processors 902 or processor cores 907. In on embodiment, the system 900 is a processing platform incorporated within a system-on-a-chip (SoC) integrated circuit for use in mobile, handheld, or embedded devices.

An embodiment of system 900 can include, or be incorporated within a server-based gaming platform, a game console, including a game and media console, a mobile gaming console, a handheld game console, or an online game console. In some embodiments system 900 is a mobile phone, smart phone, tablet computing device or mobile Internet device. Data processing system 900 can also include, couple with, or be integrated within a wearable device, such as a smart watch wearable device, smart eyewear device, augmented reality device, or virtual reality device. In some embodiments, data processing system 900 is a television or set top box device having one or more processors 902 and a graphical interface generated by one or more graphics processors 908.

In some embodiments, the one or more processors 902 each include one or more processor cores 907 to process instructions which, when executed, perform operations for system and user software. In some embodiments, each of the one or more processor cores 907 is configured to process a specific instruction set 909. In some embodiments, instruction set 909 may facilitate Complex Instruction Set Computing (CISC), Reduced Instruction Set Computing (RISC), or computing via a Very Long Instruction Word (VLIW). Multiple processor cores 907 may each process a different instruction set 909, which may include instructions to facilitate the emulation of other instruction sets. Processor core 907 may also include other processing devices, such a Digital Signal Processor (DSP).

In some embodiments, the processor 902 includes cache memory 904. Depending on the architecture, the processor 902 can have a single internal cache or multiple levels of internal cache. In some embodiments, the cache memory is shared among various components of the processor 902. In some embodiments, the processor 902 also uses an external cache (e.g., a Level-3 (L3) cache or Last Level Cache (LLC)) (not shown), which may be shared among processor cores 907 using known cache coherency techniques. A register file 906 is additionally included in processor 902 which may include different types of registers for storing different types of data (e.g., integer registers, floating point registers, status registers, and an instruction pointer register). Some registers may be general-purpose registers, while other registers may be specific to the design of the processor 902.

In some embodiments, processor 902 is coupled to a processor bus 910 to transmit communication signals such as address, data, or control signals between processor 902 and other components in system 900. In one embodiment the system 900 uses an exemplary 'hub' system architecture, including a memory controller hub 916 and an Input Output (I/O) controller hub 930. A memory controller hub 916 facilitates communication between a memory device and other components of system 900, while an I/O Controller Hub (ICH) 930 provides connections to I/O devices via a local I/O bus. In one embodiment, the logic of the memory controller hub 916 is integrated within the processor.

Memory device 920 can be a dynamic random access memory (DRAM) device, a static random access memory (SRAM) device, flash memory device, phase-change memory device, or some other memory device having suitable performance to serve as process memory. In one embodiment the memory device 920 can operate as system memory for the system 900, to store data 922 and instructions 921 for use when the one or more processors 902 executes an application or process. Memory controller hub 916 also couples with an optional external graphics processor 912, which may communicate with the one or more graphics processors 908 in processors 902 to perform graphics and media operations.

In some embodiments, ICH 930 enables peripherals to connect to memory device 920 and processor 902 via a high-speed I/O bus. The I/O peripherals include, but are not limited to, an audio controller 946, a firmware interface 928, a wireless transceiver 926 (e.g., Wi-Fi, Bluetooth), a data storage device 924 (e.g., hard disk drive, flash memory, etc.), and a legacy I/O controller 940 for coupling legacy (e.g., Personal System 2 (PS/2)) devices to the system. One or more Universal Serial Bus (USB) controllers 942 connect input devices, such as keyboard and mouse 944 combinations. A network controller 934 may also couple to ICH 930. In some embodiments, a high-performance network controller (not shown) couples to processor bus 910. It will be appreciated that the system 900 shown is exemplary and not limiting, as other types of data processing systems that are differently configured may also be used. For example, the I/O controller hub 930 may be integrated within the one or more processor 902, or the memory controller hub 916 and I/O controller hub 930 may be integrated into a discreet external graphics processor, such as the external graphics processor 912.

Figure 10:
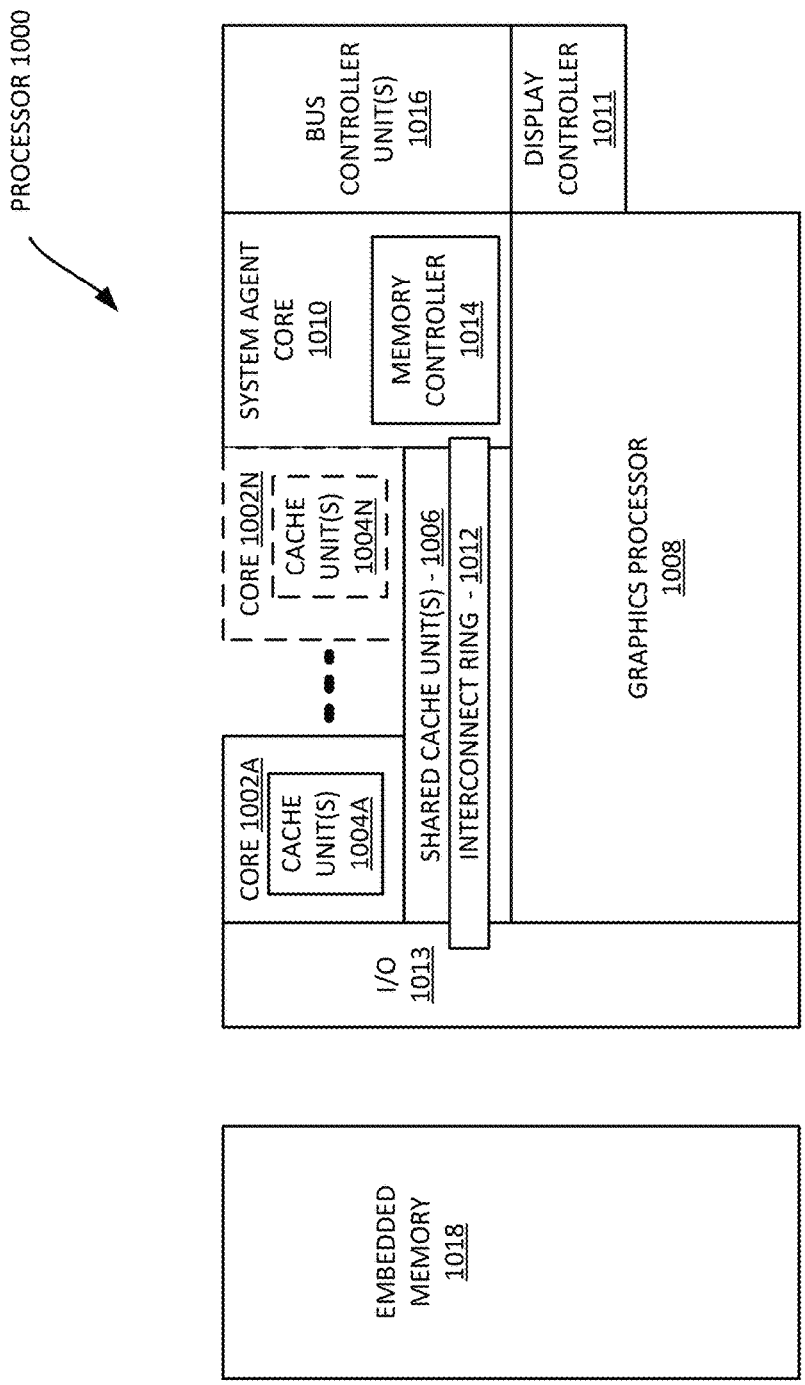
FIGS. 10 and 11 illustrate various components of processors in accordance with some embodiments.

FIG. 10 is a block diagram of an embodiment of a processor 1000 having one or more processor cores 1002A-1002N, an integrated memory controller 1014, and an integrated graphics processor 1008. Those elements of FIG. 10 having the same reference numbers (or names) as the elements of any other figure herein can operate or function in any manner similar to that described elsewhere herein, but are not limited to such. Processor 1000 can include additional cores up to and including additional core 1002N represented by the dashed lined boxes. Each of processor cores 1002A-1002N includes one or more internal cache units 1004A-1004N. In some embodiments each processor core also has access to one or more shared cached units 1006.

The internal cache units 1004A-1004N and shared cache units 1006 represent a cache memory hierarchy within the processor 1000. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1006 and 1004A-1004N.

In some embodiments, processor 1000 may also include a set of one or more bus controller units 1016 and a system agent core 1010. The one or more bus controller units 1016 manage a set of peripheral buses, such as one or more Peripheral Component Interconnect buses (e.g., PCI, PCI Express). System agent core 1010 provides management functionality for the various processor components. In some embodiments, system agent core 1010 includes one or more integrated memory controllers 1014 to manage access to various external memory devices (not shown).

In some embodiments, one or more of the processor cores 1002A-1002N include support for simultaneous multi-threading. In such embodiment, the system agent core 1010 includes components for coordinating and operating cores 1002A-1002N during multi-threaded processing. System agent core 1010 may additionally include a power control unit (PCU), which includes logic and components to regulate the power state of processor cores 1002A-1002N and graphics processor 1008.

In some embodiments, processor 1000 additionally includes graphics processor 1008 to execute graphics processing operations. In some embodiments, the graphics processor 1008 couples with the set of shared cache units 1006, and the system agent core 1010, including the one or more integrated memory controllers 1014. In some embodiments, a display controller 1011 is coupled with the graphics processor 1008 to drive graphics processor output to one or more coupled displays. In some embodiments, display controller 1011 may be a separate module coupled with the graphics processor via at least one interconnect, or may be integrated within the graphics processor 1008 or system agent core 1010.

In some embodiments, a ring based interconnect unit 1012 is used to couple the internal components of the processor 1000. However, an alternative interconnect unit may be used, such as a point-to-point interconnect, a switched interconnect, or other techniques, including techniques well known in the art. In some embodiments, graphics processor 1008 couples with the ring interconnect 1012 via an I/O link 1013.

The exemplary I/O link 1013 represents at least one of multiple varieties of I/O interconnects, including an on package I/O interconnect which facilitates communication between various processor components and a high-performance embedded memory module 1018, such as an eDRAM (or embedded DRAM) module. In some embodiments, each of the processor cores 1002-1002N and graphics processor 1008 use embedded memory modules 1018 as a shared Last Level Cache.

In some embodiments, processor cores 1002A-1002N are homogenous cores executing the same instruction set architecture. In another embodiment, processor cores 1002A-1002N are heterogeneous in terms of instruction set architecture (ISA), where one or more of processor cores 1002A-

1002N execute a first instruction set, while at least one of the other cores executes a subset of the first instruction set or a different instruction set. In one embodiment processor cores 1002A-1002N are heterogeneous in terms of microarchitecture, where one or more cores having a relatively higher power consumption couple with one or more power cores having a lower power consumption. Additionally, processor 1000 can be implemented on one or more chips or as an SoC integrated circuit having the illustrated components, in addition to other components.

Figure 11:
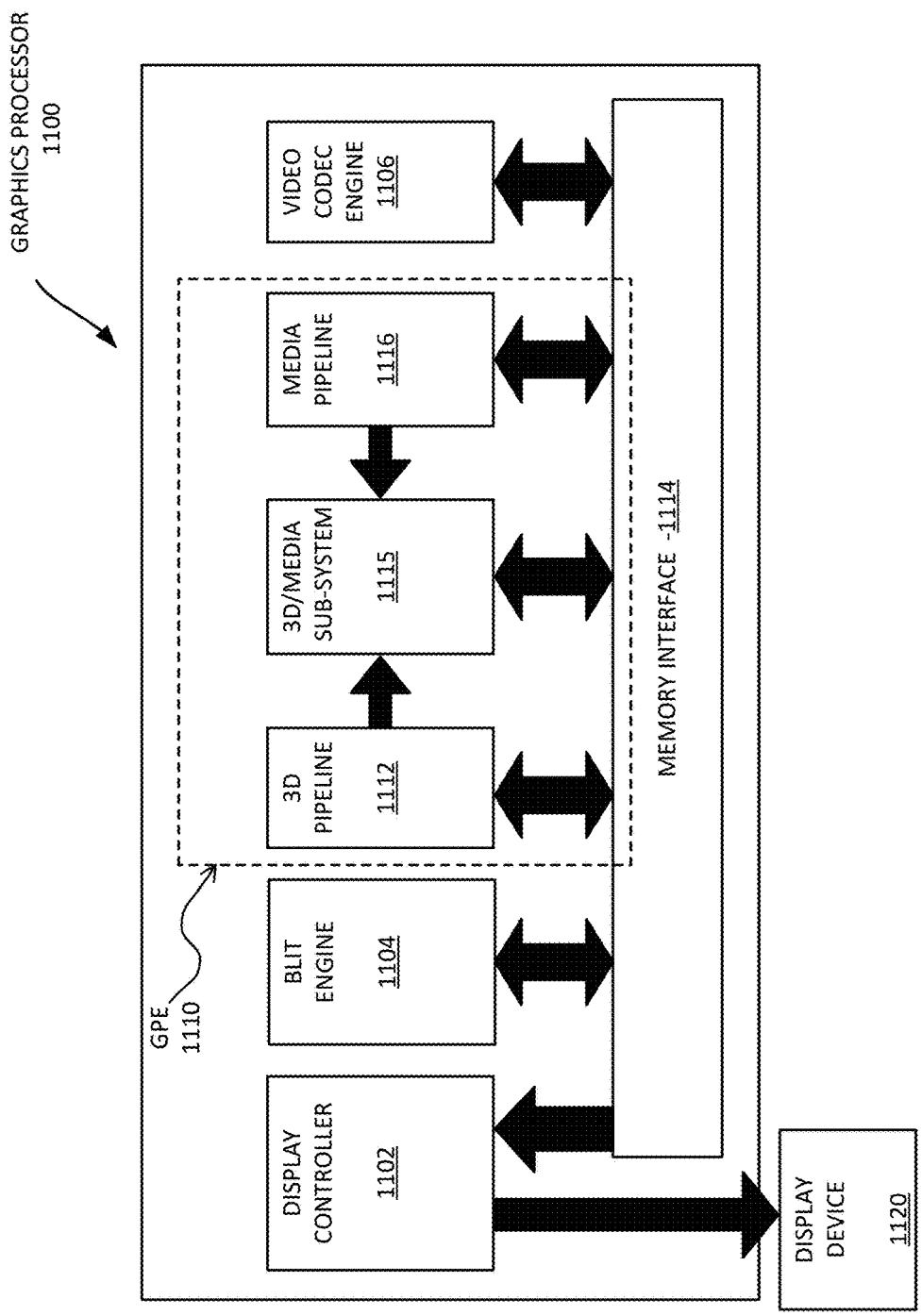

FIG. 11 is a block diagram of a graphics processor 1100, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 1100 includes a memory interface 1114 to access memory. Memory interface 1114 can be an interface to local memory, one or more internal caches, one or more shared external caches, and/or to system memory.

In some embodiments, graphics processor 1100 also includes a display controller 1102 to drive display output data to a display device 1120. Display controller 1102 includes hardware for one or more overlay planes for the display and composition of multiple layers of video or user interface elements. In some embodiments, graphics processor 1100 includes a video codec engine 1106 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 1100 includes a block image transfer (BLIT) engine 1104 to perform two-dimensional (2D) rasterizer operations including, for example, bit-boundary block transfers. However, in one embodiment, 11D graphics operations are performed using one or more components of graphics processing engine (GPE) 1110. In some embodiments, graphics processing engine 1110 is a compute engine for performing graphics operations, including three-dimensional (3D) graphics operations and media operations.

In some embodiments, GPE 1110 includes a 3D pipeline 1112 for performing 3D operations, such as rendering three-dimensional images and scenes using processing functions that act upon 3D primitive shapes (e.g., rectangle, triangle, etc.). The 3D pipeline 1112 includes programmable and fixed function elements that perform various tasks within the element and/or spawn execution threads to a 3D/Media sub-system 1115. While 3D pipeline 1112 can be used to perform media operations, an embodiment of GPE 1110 also includes a media pipeline 1116 that is specifically used to perform media operations, such as video post-processing and image enhancement.

In some embodiments, media pipeline 1116 includes fixed function or programmable logic units to perform one or more specialized media operations, such as video decode acceleration, video de-interlacing, and video encode acceleration in place of, or on behalf of video codec engine 1106. In some embodiments, media pipeline 1116 additionally includes a thread spawning unit to spawn threads for execution on 3D/Media sub-system 1115. The spawned threads perform computations for the media operations on one or more graphics execution units included in 3D/Media subsystem 1115.

In some embodiments, 3D/Media subsystem 1115 includes logic for executing threads spawned by 3D pipeline 1112 and media pipeline 1116. In one embodiment, the pipelines send thread execution requests to 3D/Media subsystem 1115, which includes thread dispatch logic for arbitrating and dispatching the various requests to available thread execution resources. The execution resources include an array of graphics execution units to process the 3D and media threads. In some embodiments, 3D/Media subsystem 1115 includes one or more internal caches for thread instructions and data. In some embodiments, the subsystem also includes shared memory, including registers and addressable memory, to share data between threads and to store output data.

The following examples pertain to further embodiments. Example 1 includes an apparatus comprising: a metallic shield to at least partially surround at least one logic component, wherein the metallic shield is to comprise a dome feature to provide thermal contact between the at least one logic component and the metallic shield. Example 2 includes the apparatus of example 1, wherein the metallic shield is to provide Electromagnetic Interference protection for the at least one logic component. Example 3 includes the apparatus of example 1, wherein dome feature is to protrude outward away from a surface of the at least one logic component prior to a surface mount process. Example 4 includes the apparatus of example 3, wherein the protruded dome feature is to provide the thermal contact between the at least one logic component and the metallic shield after the protruded dome feature is pushed towards the surface of the at least one logic component. Example 5 includes the apparatus of example 3, wherein the surface of the at least one logic component is a top surface or a side surface of the at least one logic component. Example 6 includes the apparatus of example 3, wherein a gap to be provided between the protruded dome feature and the at least one logic component or between the metallic shield and the at least one logic component is to be about 2 mm. Example 7 includes the apparatus of example 1, wherein the dome feature is to have a shape selected from a group comprising: a circular shape, a square shape, an elliptical shape, a rectangular shape, a polygonal shape, or combinations thereof. Example 8 includes the apparatus of example 1, wherein the metallic shield is to be constructed of a sheet metal. Example 9 includes the apparatus of example 8, wherein the sheet metal is to have a thickness of about 0.3 mm to 0.5 mm. Example 10 includes the apparatus of example 1, wherein the dome feature is to be provided during a same stamping process that provides the metallic shield. Example 11 includes the apparatus of example 1, further comprising a heat spreader to be provided between the at least one logic component and the dome feature. Example 12 includes the apparatus of example 1, wherein the dome feature is to be provided during a different stamping process than the metallic shield. Example 13 includes the apparatus of example 1, wherein the at least one logic component and the metallic shield are to be attached to a circuit board. Example 14 includes the apparatus of example 1, wherein the at least one logic component or the metallic shield are to be soldered to a circuit board. Example 15 includes the apparatus of example 1, wherein the at least one logic component and the metallic shield are to be provided on a printed circuit board. Example 16 includes the apparatus of example 1, wherein the at least one logic component is to comprise a Graphics Processing Unit (GPU) or a Central Processing Unit (CPU). Example 17 includes the apparatus of example 16, wherein the CPU or the GPU is to comprise one or more cores. Example 18 includes the apparatus of example 16, wherein one or more of the GPU, the CPU, or memory are on a single integrated circuit die.

Example 19 includes a system comprising: a processor, coupled to memory, the memory to store one or more instructions to be executed by the processor; a metallic shield to at least partially surround at least one logic component coupled to the processor or the memory, wherein the metallic shield is to comprise a dome feature to provide thermal contact between the at least one logic component and the metallic shield. Example 20 includes the system of example 19, wherein the metallic shield is to provide Electromagnetic Interference protection for the at least one logic component. Example 21 includes the system of example 19, wherein dome feature is to protrude outward away from a surface of the at least one logic component prior to a surface mount process. Example 22 includes the system of example 21, wherein the protruded dome feature is to provide the thermal contact between the at least one logic component and the metallic shield after the protruded dome feature is pushed towards the surface of the at least one logic component. Example 23 includes the system of example 21, wherein the surface of the at least one logic component is a top surface or a side surface of the at least one logic component. Example 24 includes the system of example 21, wherein a gap to be provided between the protruded dome feature and the at least one logic component or between the metallic shield and the at least one logic component is to be about 2 mm. Example 25 includes the system of example 19, wherein the dome feature is to have a shape selected from a group comprising: a circular shape, a square shape, an elliptical shape, a rectangular shape, a polygonal shape, or combinations thereof. Example 26 includes the system of example 19, wherein the metallic shield is to be constructed of a sheet metal. Example 27 includes the system of example 26, wherein the sheet metal is to have a thickness of about 0.3 mm to 0.5 mm. Example 28 includes the system of example 19, wherein the dome feature is to be provided during a same stamping process that provides the metallic shield. Example 29 includes the system of example 19, further comprising a heat spreader to be provided between the at least one logic component and the dome feature. Example 30 includes the system of example 19, wherein the dome feature is to be provided during a different stamping process than the metallic shield. Example 31 includes the system of example 19, wherein the at least one logic component and the metallic shield are to be attached to a circuit board. Example 32 includes the system of example 19, wherein the at least one logic component or the metallic shield are to be soldered to a circuit board. Example 33 includes the system of example 19, wherein the at least one logic component and the metallic shield are to be provided on a printed circuit board. Example 34 includes the system of example 19, wherein the at least one logic component is to comprise a Graphics Processing Unit (GPU) or a Central Processing Unit (CPU). Example 35 includes the system of example 34, wherein the CPU or the GPU is to comprise one or more cores. Example 36 includes the system of example 34, wherein one or more of the GPU, the CPU, or memory are on a single integrated circuit die.

Example 37 includes a method comprising: providing a metallic shield to at least partially surround at least one logic component, wherein the metallic shield comprises a dome feature to provide thermal contact between the at least one logic component and the metallic shield. Example 38 includes the method of example 37, wherein the metallic shield provides Electromagnetic Interference protection for the at least one logic component. Example 39 includes the method of example 37, wherein dome feature protrudes outward away from a surface of the at least one logic component prior to a surface mount process. Example 40 includes the method of example 37, wherein the dome feature has a shape selected from a group comprising: a circular shape, a square shape, an elliptical shape, a rectangular shape, a polygonal shape, or combinations thereof. Example 41 includes the method of example 37, further comprising providing the dome feature during a same stamping process that provides the metallic shield. Example 42 includes the method of example 37, further comprising providing the dome feature during a different stamping process than the metallic shield.

Example 43 includes an apparatus comprising means to perform a method as set forth in any preceding example. Example 44 comprises machine-readable storage including machine-readable instructions, when executed, to implement a method or realize an apparatus as set forth in any preceding example.

In various embodiments, the operations discussed herein, e.g., with reference to FIGS. 1-11, may be implemented as hardware (e.g., logic circuitry), software, firmware, or combinations thereof, which may be provided as a computer program product, e.g., including a tangible (e.g., non-transitory) machine-readable or computer-readable medium having stored thereon instructions (or software procedures) used to program a computer to perform a process discussed herein. The machine-readable medium may include a storage device such as those discussed with respect to FIGS. 1-11.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
a metallic shield to at least partially surround at least one logic component, wherein the metallic shield is to comprise a dome feature to provide thermal contact between the at least one logic component and the metallic shield, wherein the dome feature is to have a continuous surface, wherein the dome feature is to at least partially protrude outward away from a surface of the at least one logic component prior to a mounting process, wherein the protruded dome feature is to provide the thermal contact between the at least one logic component and the metallic shield after the protruded dome feature is pushed towards the surface of the at least one logic component.

2. The apparatus of claim 1, wherein the metallic shield is to provide Electromagnetic Interference protection for the at least one logic component.

3. The apparatus of claim 1, wherein the surface of the at least one logic component is a top surface or a side surface of the at least one logic component.

4. The apparatus of claim 1, wherein a gap to be provided between the protruded dome feature and the at least one logic component or between the metallic shield and the at least one logic component is to be 2 mm.

5. The apparatus of claim 1, wherein the dome feature is to have a shape selected from a group consisting of: a circular shape, a square shape, an elliptical shape, a rectangular shape, a polygonal shape, or combinations thereof.

6. The apparatus of claim 1, wherein the metallic shield is to be constructed of a sheet metal.

7. The apparatus of claim 6, wherein the sheet metal is to have a thickness between 0.3 mm and 0.5 mm.

8. The apparatus of claim 1, wherein the dome feature is to be provided during a same stamping process that provides the metallic shield.

9. The apparatus of claim 1, further comprising a heat spreader to be provided between the at least one logic component and the dome feature.

10. The apparatus of claim 1, wherein the dome feature is to be provided during a different stamping process than the metallic shield.

11. The apparatus of claim 1, wherein the at least one logic component and the metallic shield are to be attached to a circuit board.

12. The apparatus of claim 1, wherein the at least one logic component or the metallic shield are to be soldered to a circuit board.

13. The apparatus of claim 1, wherein the at least one logic component and the metallic shield are to be provided on a printed circuit board.

14. The apparatus of claim 1, wherein the at least one logic component is to comprise a Graphics Processing Unit (GPU) or a Central Processing Unit (CPU).

15. The apparatus of claim 14, wherein the CPU or the GPU is to comprise one or more cores.

16. The apparatus of claim 14, wherein one or more of the GPU, the CPU, or memory are on a single integrated circuit die.

17. The apparatus of claim 1, wherein the mounting process is a surface mount process.

18. A system comprising:
a processor, coupled to memory, the memory to store one or more instructions to be executed by the processor;
a metallic shield to at least partially surround at least one logic component coupled to the processor or the memory,
wherein the metallic shield is to comprise a dome feature to provide thermal contact between the at least one logic component and the metallic shield, wherein the dome feature is to have a continuous surface, wherein the dome feature is to at least partially protrude outward away from a surface of the at least one logic component prior to a mounting process, wherein the protruded dome feature is to provide the thermal contact between the at least one logic component and the metallic shield after the protruded dome feature is pushed towards the surface of the at least one logic component.

19. The system of claim 18, wherein the metallic shield is to provide Electromagnetic Interference protection for the at least one logic component.

20. The system of claim 18, wherein the dome feature is to have a shape selected from a group consisting of: a circular shape, a square shape, an elliptical shape, a rectangular shape, a polygonal shape, or combinations thereof.

21. The system of claim 18, wherein the mounting process is a surface mount process.

22. A method comprising:
providing a metallic shield to at least partially surround at least one logic component,
wherein the metallic shield comprises a dome feature to provide thermal contact between the at least one logic component and the metallic shield, wherein the dome feature has a continuous surface, wherein the dome feature at least partially protrudes outward away from a surface of the at least one logic component prior to a mounting process, wherein the protruded dome feature provides the thermal contact between the at least one logic component and the metallic shield after the protruded dome feature is pushed towards the surface of the at least one logic component.

23. The method of claim 22, further comprising providing the dome feature during a same stamping process that provides the metallic shield.

24. The method of claim 22, further comprising providing the dome feature during a different stamping process than the metallic shield.

25. The method of claim 22, wherein the mounting process is a surface mount process.

* * * * *